(12) United States Patent
Sunaoshi et al.

(10) Patent No.: US 10,784,074 B2
(45) Date of Patent: Sep. 22, 2020

(54) CHARGED PARTICLE BEAM APPARATUS AND CONTROL METHOD THEREOF

(71) Applicant: HITACHI HIGH-TECHNOLOGIES CORPORATION, Tokyo (JP)

(72) Inventors: Takeshi Sunaoshi, Tokyo (JP); Yoshihisa Orai, Tokyo (JP); Haruhiko Hatano, Tokyo (JP); Takashi Mizuo, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 119 days.

(21) Appl. No.: 15/777,121

(22) PCT Filed: Nov. 29, 2016

(86) PCT No.: PCT/JP2016/085325
§ 371 (c)(1),
(2) Date: May 17, 2018

(87) PCT Pub. No.: WO2017/098958
PCT Pub. Date: Jun. 15, 2017

(65) Prior Publication Data
US 2018/0350554 A1  Dec. 6, 2018

(30) Foreign Application Priority Data

Dec. 8, 2015  (WO) .................. PCT/JP2015/084360

(51) Int. Cl.
*F25B 19/00* (2006.01)
*F25B 9/00* (2006.01)
(Continued)

(52) U.S. Cl.
CPC ............ *H01J 37/20* (2013.01); *F25B 19/005* (2013.01); *H01J 37/28* (2013.01);
(Continued)

(58) Field of Classification Search
CPC . F25B 9/00; F25B 19/005; B01D 8/00; A61B 18/02; A61B 18/0218;
(Continued)

(56) References Cited

U.S. PATENT DOCUMENTS

| 5,334,181 A * | 8/1994 | Rubinsky | A61B 18/02 606/20 |
| 6,046,457 A * | 4/2000 | Bohnenkamp | H01J 37/02 250/397 |

(Continued)

FOREIGN PATENT DOCUMENTS

| JP | 10149791 A * | 6/1998 |
| JP | H10-149791 A | 6/1998 |

(Continued)

OTHER PUBLICATIONS

International Search Report for WO 20171098958 A1, dated Feb. 28, 2017.

(Continued)

*Primary Examiner* — Frantz F Jules
*Assistant Examiner* — Erik Mendoza-Wilkenfel
(74) *Attorney, Agent, or Firm* — Volpe and Koenig, P.C.

(57) ABSTRACT

The invention is directed to a charged particle beam apparatus that enables temperature maintenance in a cooling unit provided inside a vacuum application apparatus using a refrigerant. The charged particle beam apparatus includes a cooling tank that contains a refrigerant for cooling a cooling unit, a cooling pipe that supplies the refrigerant from the cooling tank to the cooling unit, and a unit that leads the refrigerant to liquefy when the refrigerant is biased to a solid.

13 Claims, 14 Drawing Sheets

(51) Int. Cl.
*B01D 8/00* (2006.01)
*A61B 18/02* (2006.01)
*H01J 37/20* (2006.01)
*H01J 37/28* (2006.01)

(52) U.S. Cl.
CPC ... *H01J 2237/002* (2013.01); *H01J 2237/028* (2013.01); *H01J 2237/2001* (2013.01); *H01J 2237/262* (2013.01); *H01J 2237/28* (2013.01)

(58) Field of Classification Search
CPC ........ F17C 2223/0192; F17C 2223/048; F17C 2225/0192; F17C 2250/043; F17C 2250/0439; H01J 37/20; H01J 2237/262; H01J 2237/28; H01J 2237/028; H01J 2237/002; H01J 2237/2001
See application file for complete search history.

(56) References Cited

U.S. PATENT DOCUMENTS 8,853,648 B2    10/2014    Nagakubo et al.
2005/0204752 A1*    9/2005    Sar .......................... F17C 3/08
                                                                    62/55.5
2011/0266465 A1    11/2011    Shichi et al.
2016/0203940 A1*    7/2016    Mizuo .................... H01J 37/18
                                                                    62/48.1

FOREIGN PATENT DOCUMENTS

JP    2010-257617 A    11/2010
JP    2014-135291 A    7/2014
WO    2015/041267 A1    3/2015

OTHER PUBLICATIONS

Chinese Office Action dated Aug. 12, 2019 for the Chinese Patent Application No. 201680066784.5.
Japanese Office Action dated May 14, 2019 for the Japanese Patent Application No. 2017-555026 (with Machine English Translation).
Chinese Office Action dated Mar. 10, 2020 for the Chinese Patent Application No. 201680066784.5.

* cited by examiner

[FIG. 1A]
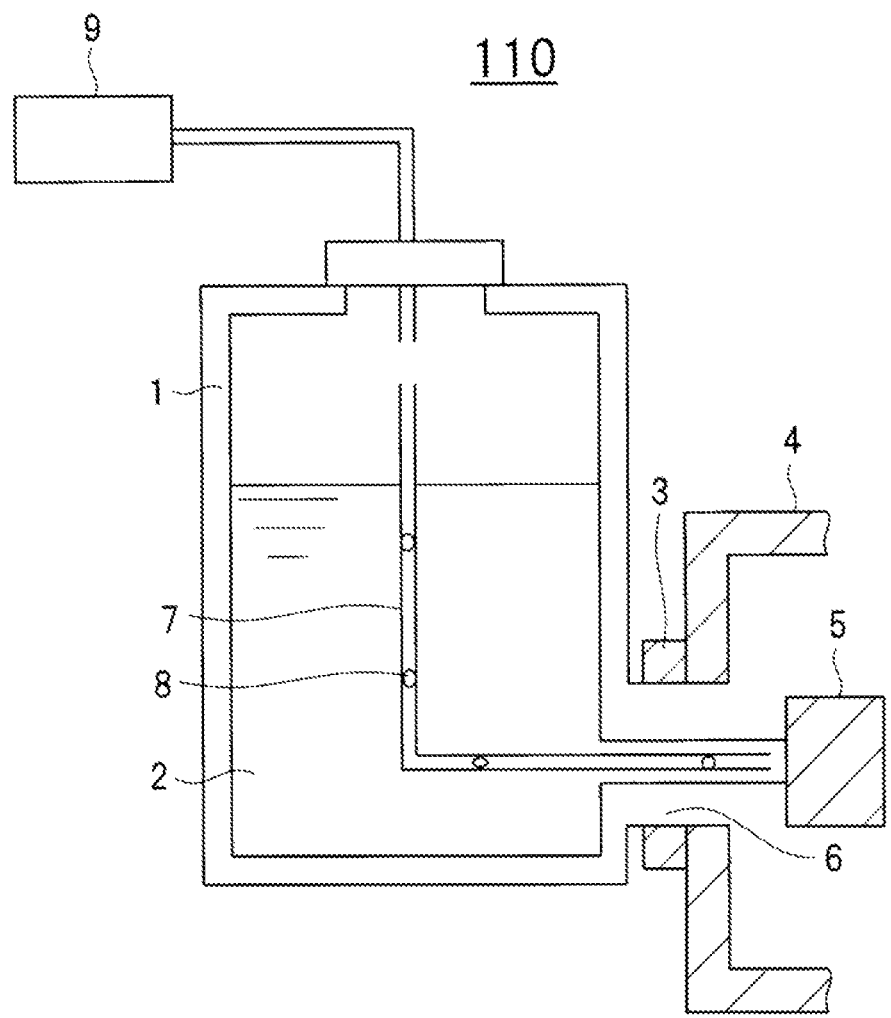
[FIG. 1B]
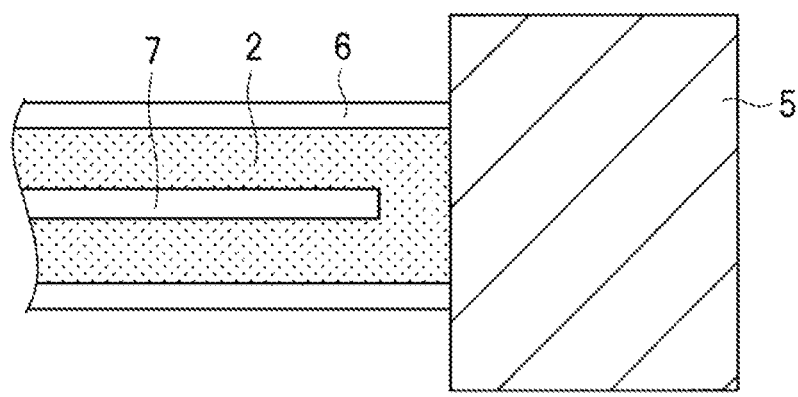

[FIG. 1C]
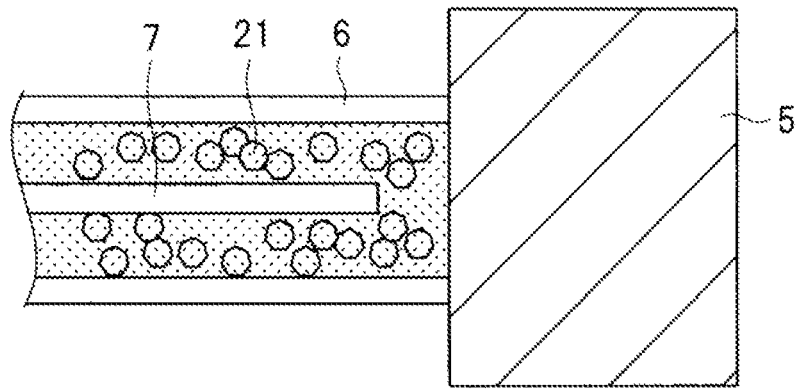
[FIG. 1D]
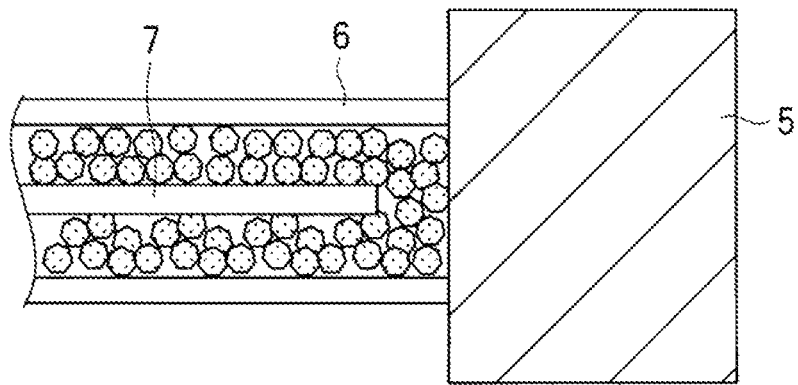

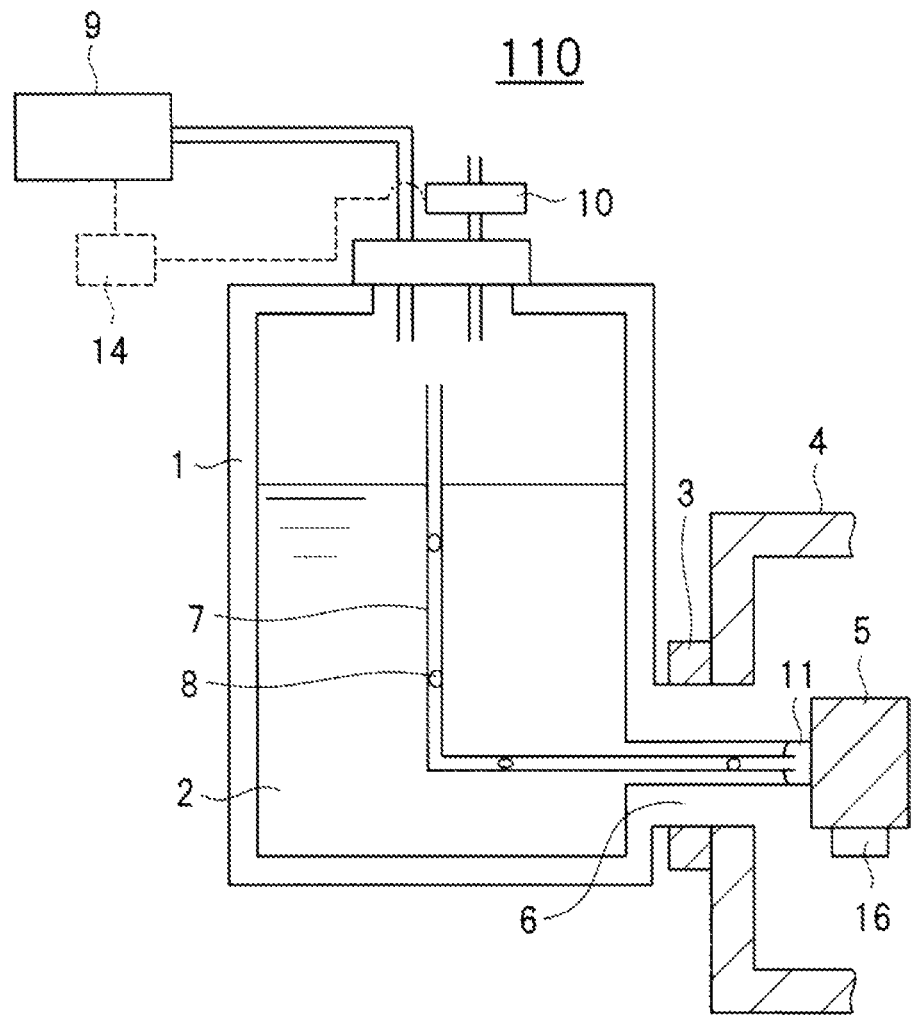
[FIG. 2]

[FIG. 3]
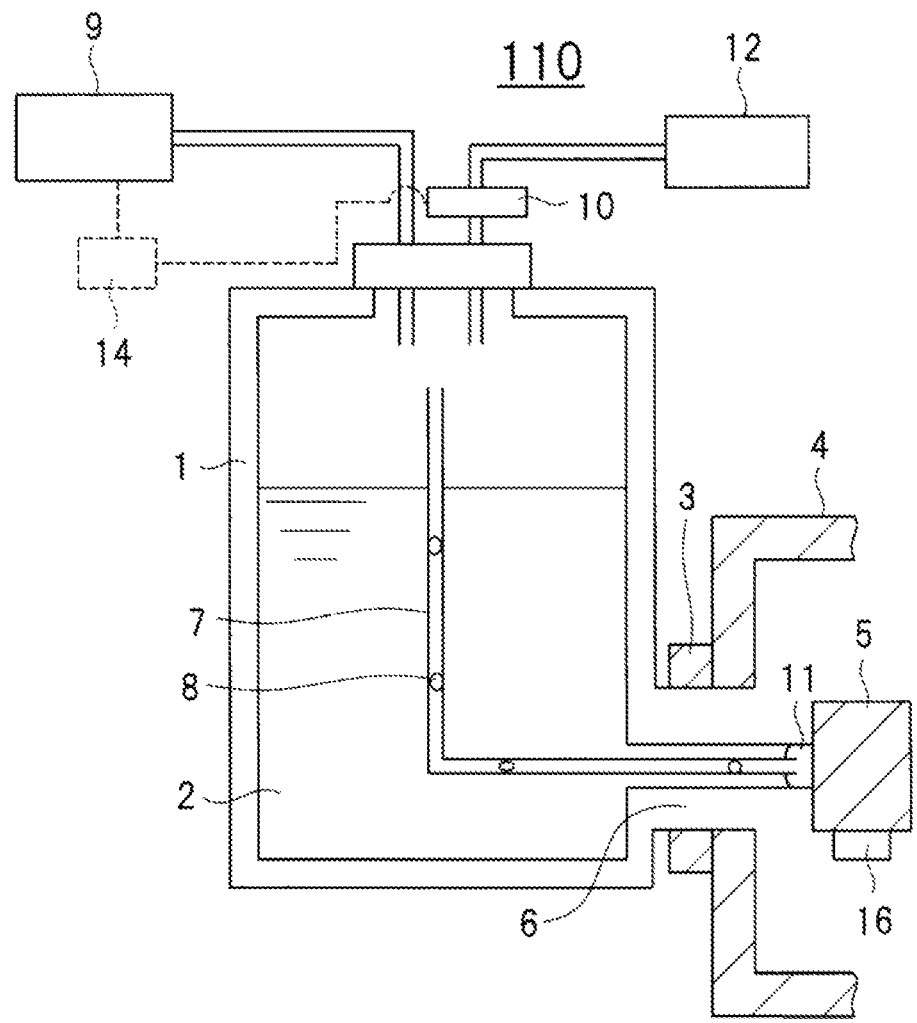

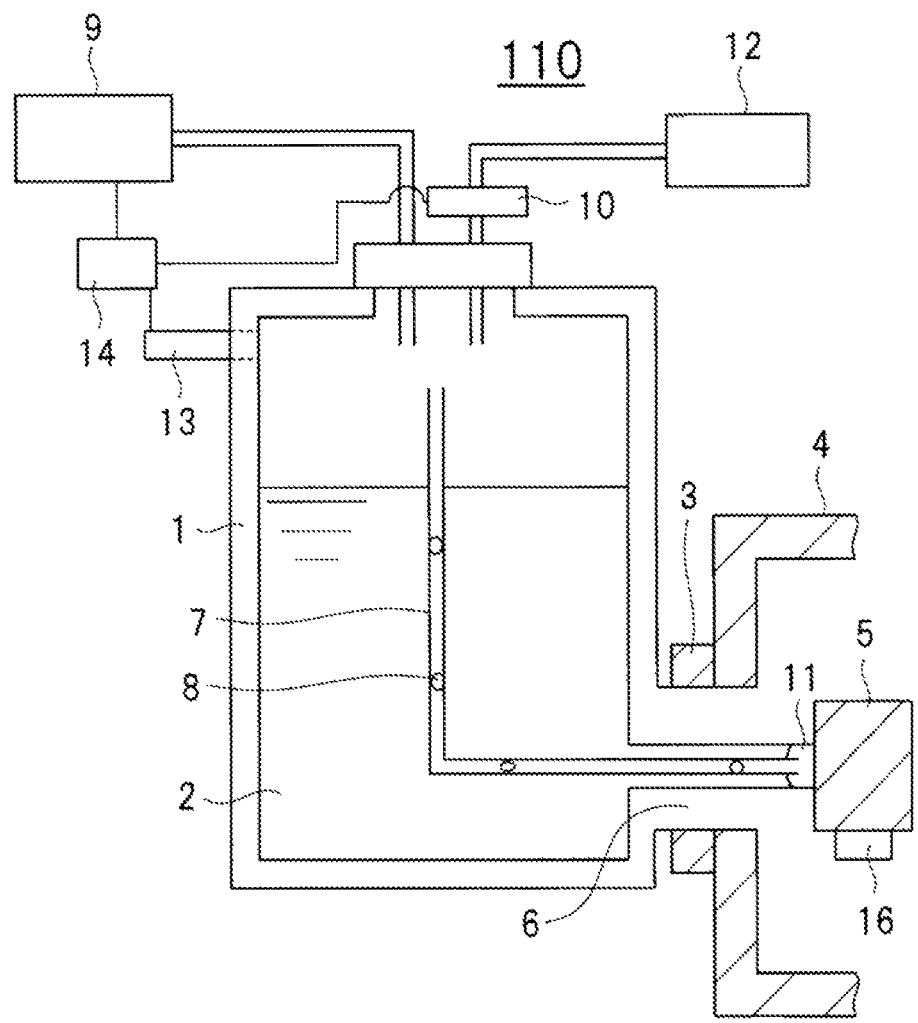
[FIG. 4]

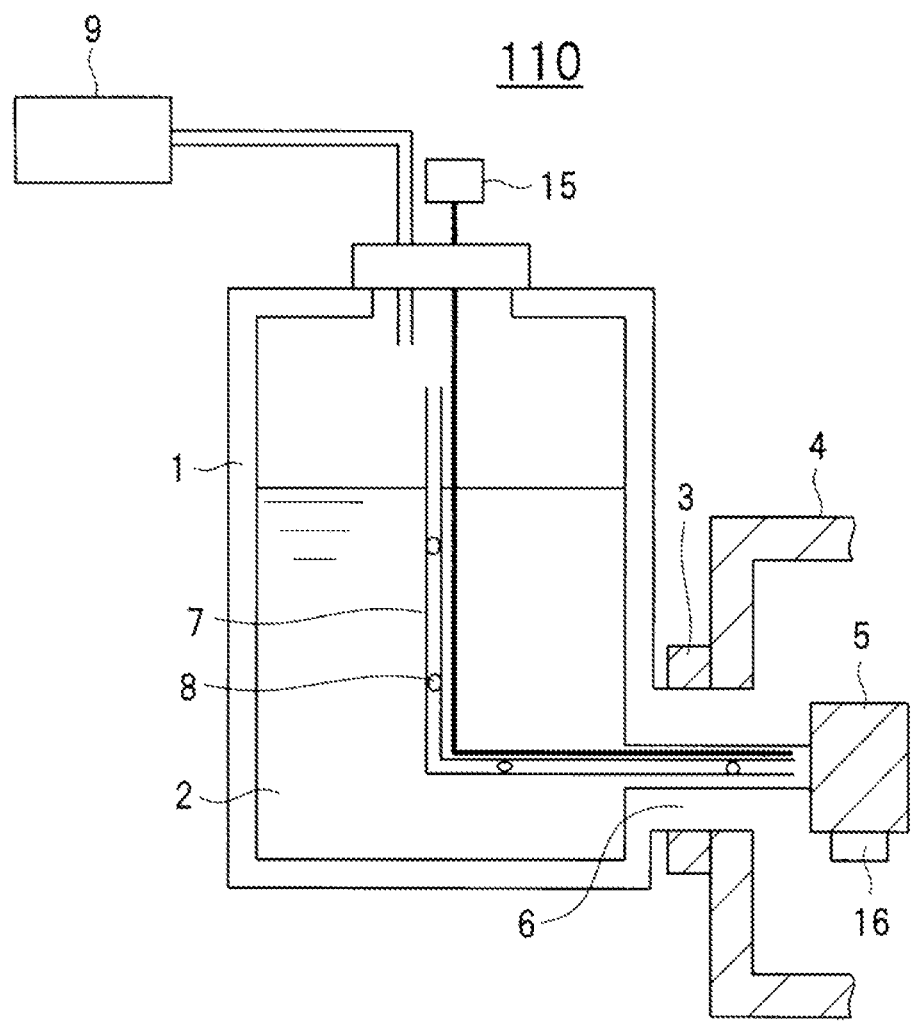
[FIG. 5]

[FIG. 6]
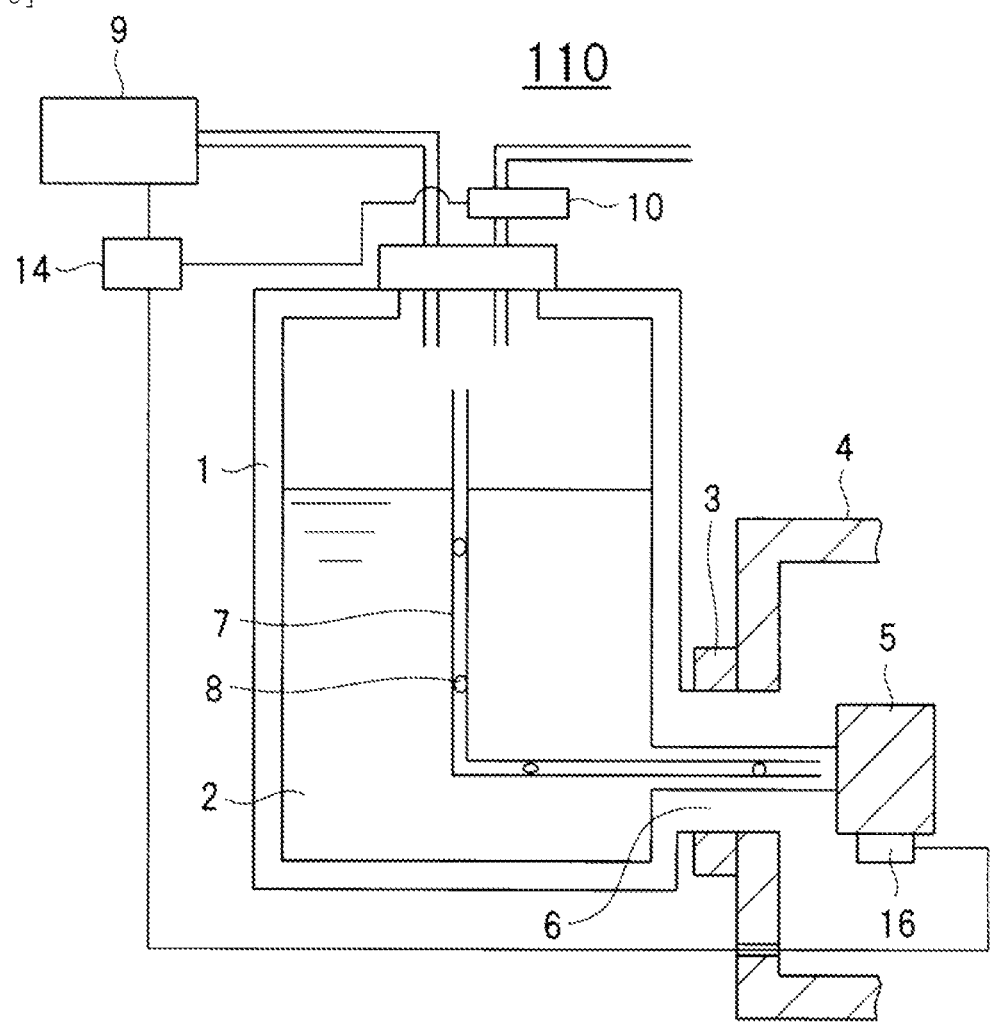

[FIG. 7]
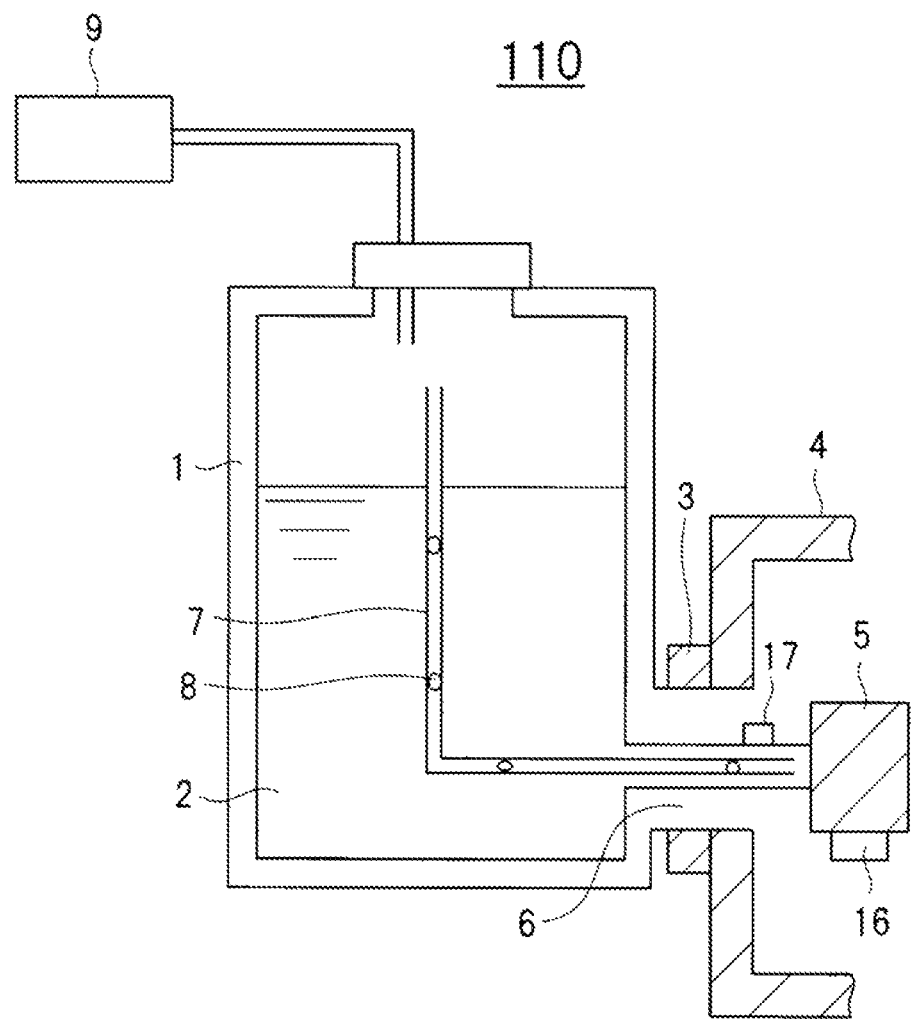

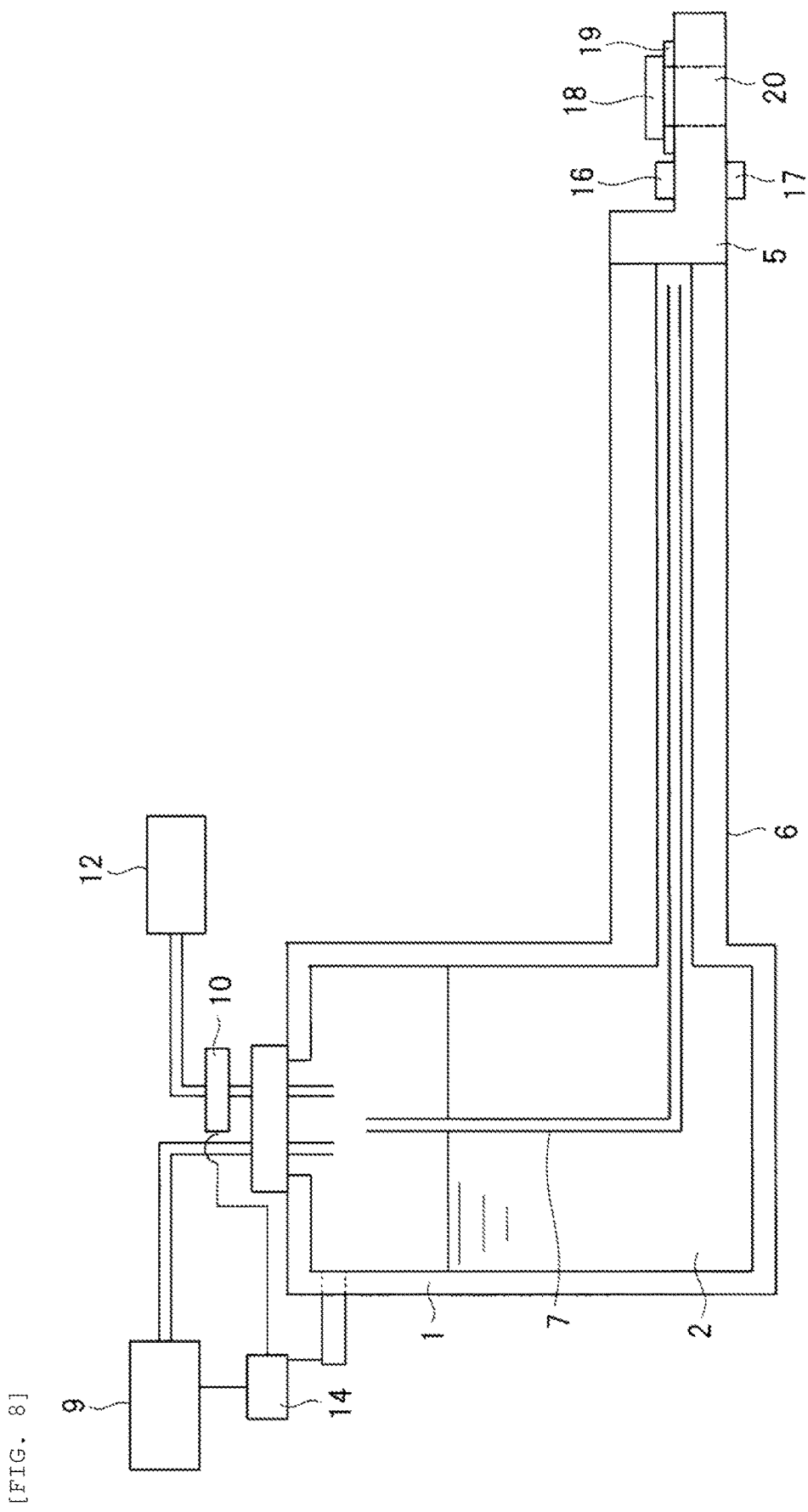
[FIG. 8]

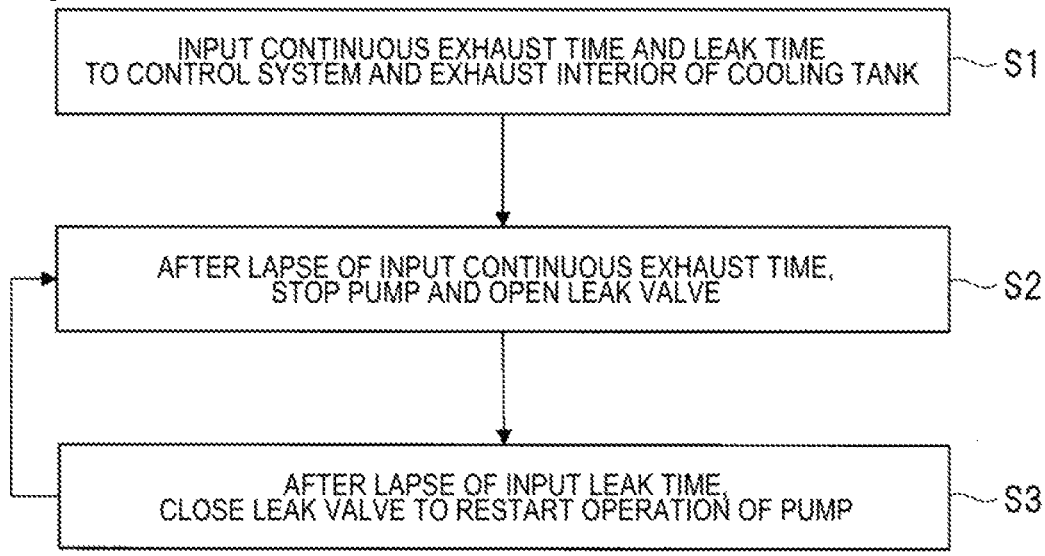
[FIG. 9]
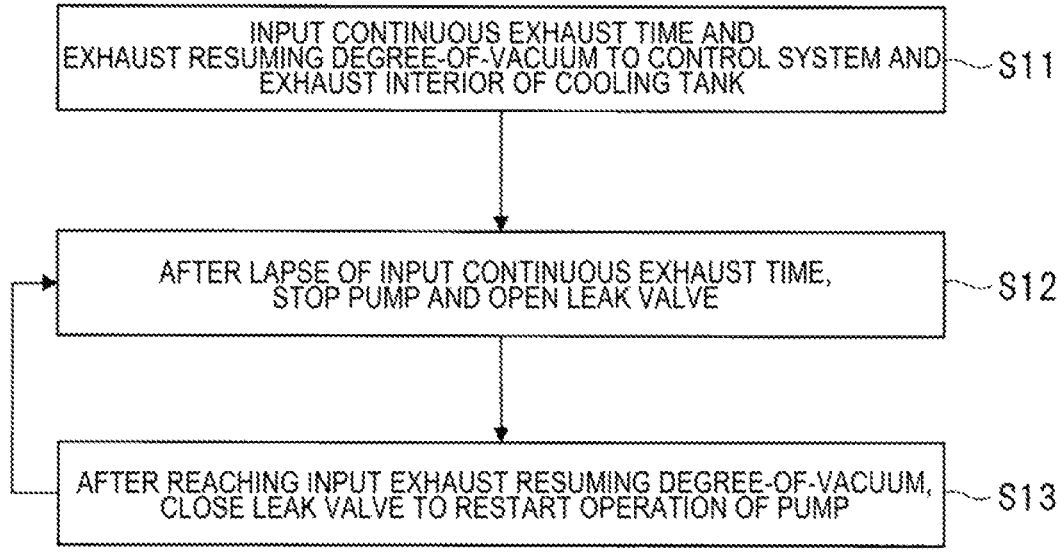
[FIG. 10]

[FIG. 11]
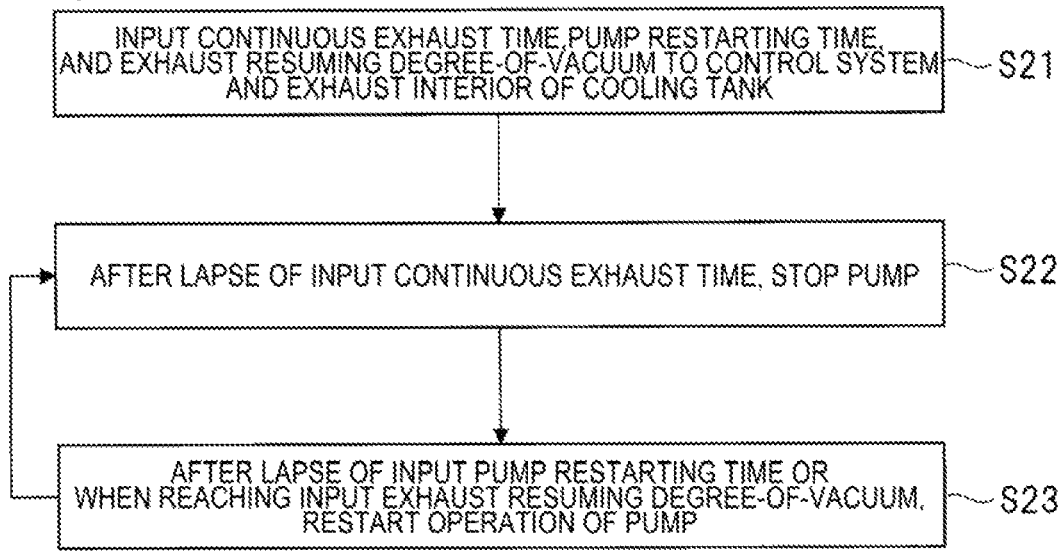
[FIG. 12]
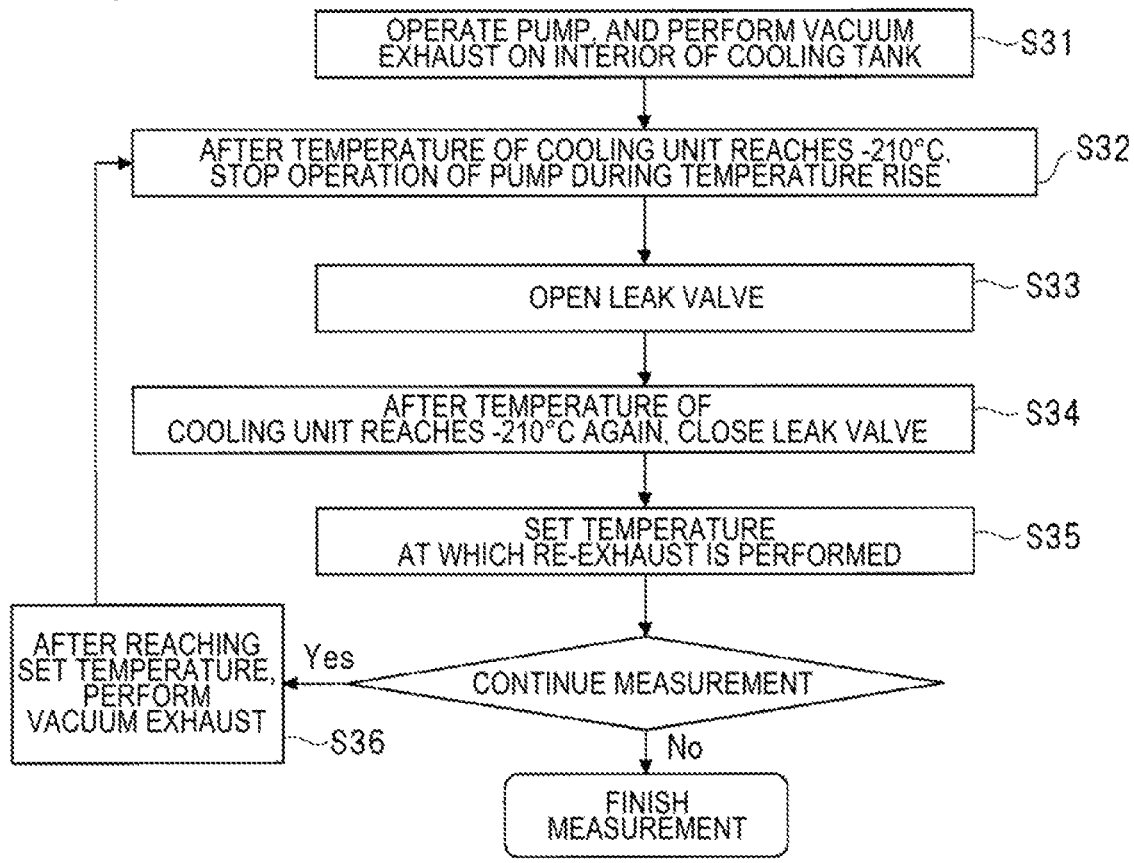

[FIG. 13]
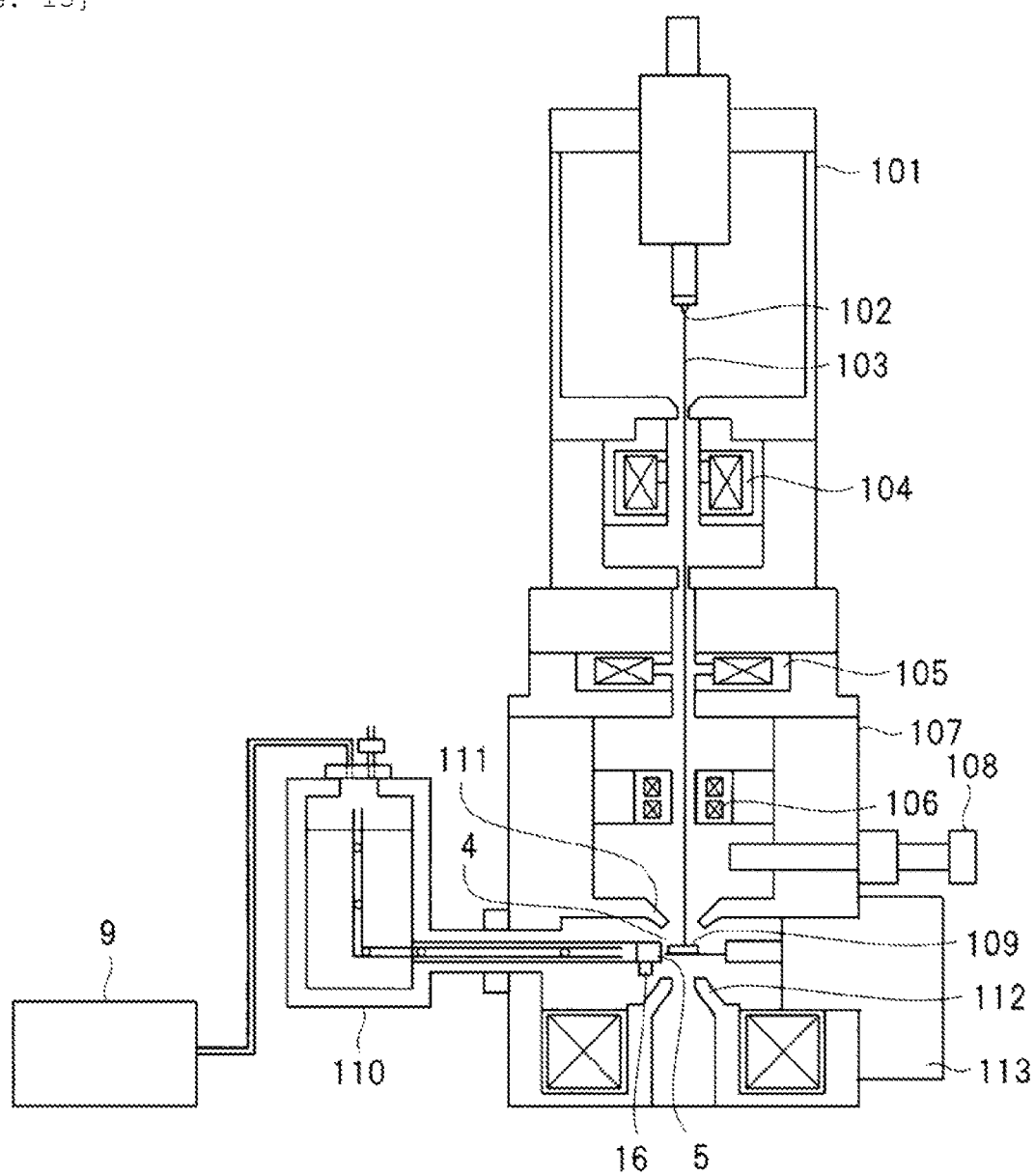

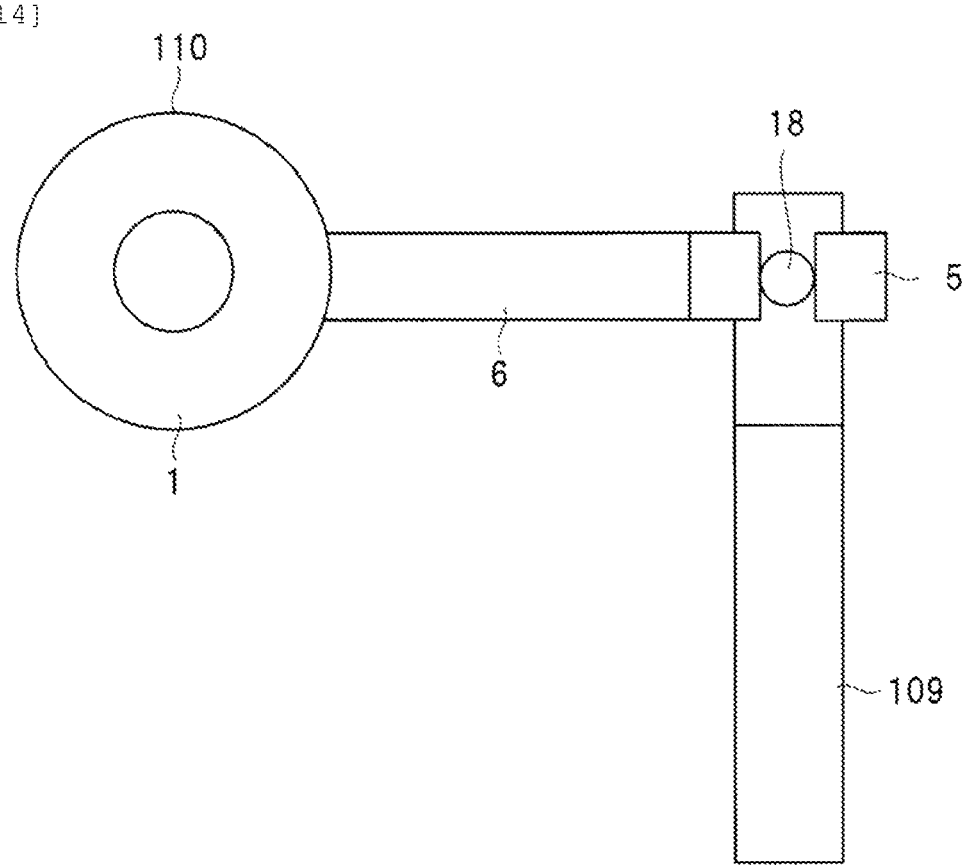
[FIG. 14]

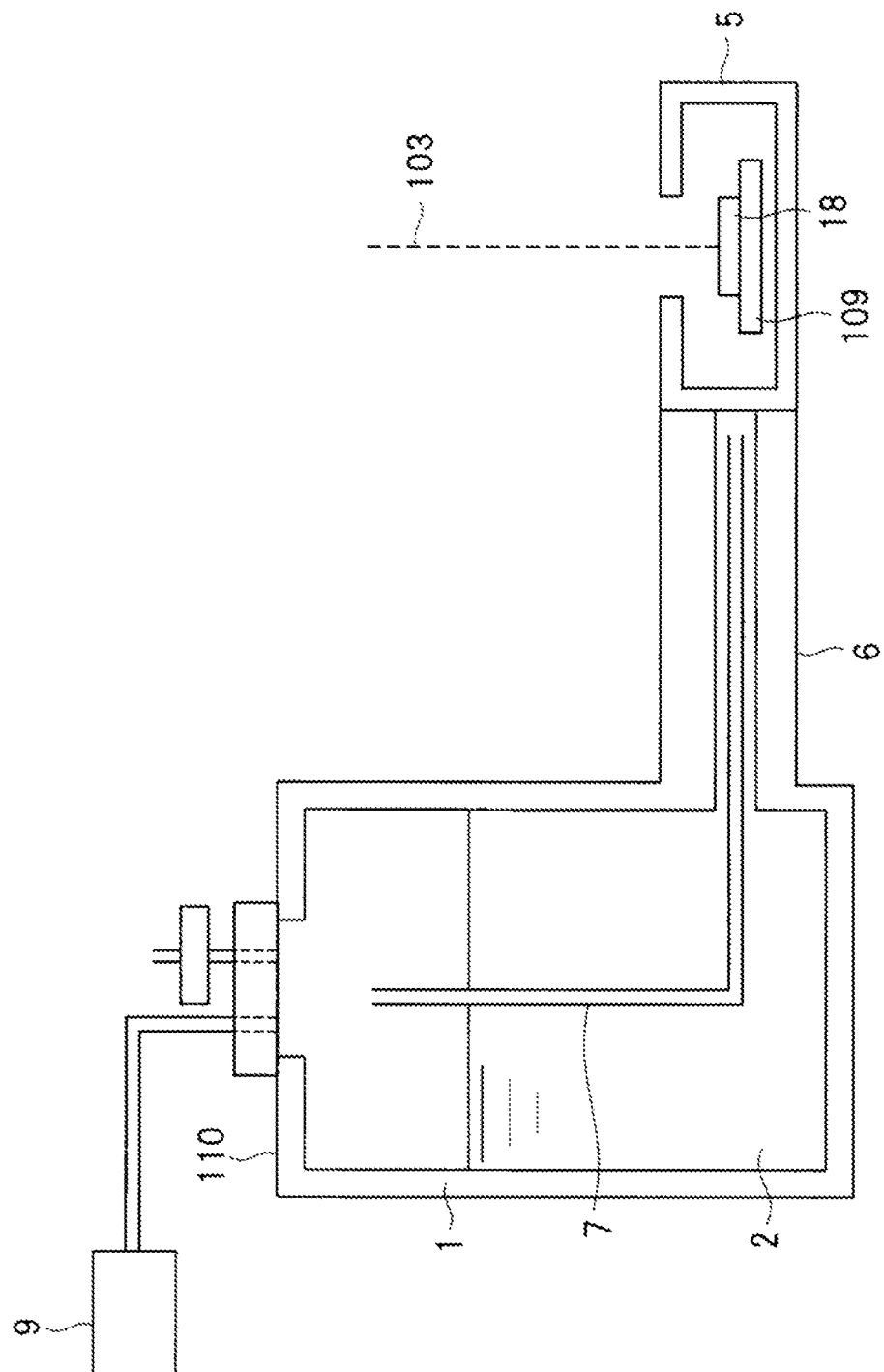
[FIG. 15]

CHARGED PARTICLE BEAM APPARATUS AND CONTROL METHOD THEREOF

TECHNICAL FIELD

The present invention relates to a charged particle beam apparatus and a control method thereof.

BACKGROUND ART

In a charged particle beam apparatus such as an electron microscope, processing and observing of a sample containing moisture, a material susceptible to damage caused by irradiation with an electron beam, and the like are enabled by processing and observing the sample while cooling, whereby such an apparatus has been widely used in fields such as of biomaterials and organic materials.

Here, a charged particle beam apparatus is disclosed in PTL 1 in which processing or observation of a material which may be affected by heat damage can be performed in a state in which the material is cooled.

In addition, an anti-contamination trap including a cooling tank for containing a refrigerant and a cooling pipe provided from the cooling tank to the vicinity of a cooling unit is disclosed in PTL 2, the refrigerant being supplied to a leading end of the cooling unit.

CITATION LIST

Patent Literature

PTL 1: JP-A-2010-257617
PTL 2: WO2015/041267

SUMMARY OF INVENTION

Technical Problem

According to the related arts, when a vacuum state is maintained, the refrigerant solidifies, the volume of the refrigerant itself is reduced, and thus the reduced part becomes a cavity. Thus, there are problems that a region where the refrigerant contacts with an inner wall of the tank decreases and heat conduction action from the refrigerant to the cooling unit also decreases.

Accordingly an object of the present invention is to provide a charged particle beam apparatus that enables temperature maintenance in a cooling unit provided inside a vacuum application apparatus using a refrigerant.

Solution to Problem

A charged particle beam apparatus according to an embodiment includes: a cooling tank that contains a refrigerant for cooling the cooling unit; a cooling pipe that supplies the refrigerant from the cooling tank to the cooling unit; and a unit that leads the refrigerant to liquefy when the refrigerant is biased to a solid.

Advantageous Effects of Invention

According to the present invention, it is possible to provide the charged particle beam apparatus that enables temperature maintenance in the cooling unit provided inside the vacuum application apparatus using the refrigerant.

BRIEF DESCRIPTION OF DRAWINGS

FIG. 1A is an explanatory diagram illustrating an anti-contamination trap according to a comparative technique with respect to the present invention.
FIG. 1B is an explanatory diagram illustrating an anti-contamination trap according to a comparative technique with respect to the present invention.
FIG. 1C is an explanatory diagram illustrating an anti-contamination trap according to a comparative technique with respect to the present invention.
FIG. 1D is an explanatory diagram illustrating an anti-contamination trap according to a comparative technique with respect to the present invention.
FIG. 2 is an explanatory diagram illustrating structure example 1 of a charged particle beam apparatus.
FIG. 3 is an explanatory diagram illustrating structure example 2 of a charged particle beam apparatus.
FIG. 4 is an explanatory diagram illustrating structure example 3 of a charged particle beam apparatus.
FIG. 5 is an explanatory diagram illustrating structure example 4 of a charged particle beam apparatus.
FIG. 6 is an explanatory diagram illustrating structure example 5 of a charged particle beam apparatus.
FIG. 7 is an explanatory diagram illustrating structure example 6 of a charged particle beam apparatus.
FIG. 8 is an explanatory diagram illustrating a structure example of a sample holder.
FIG. 9 is a flowchart illustrating control method 1.
FIG. 10 is a flowchart illustrating control method 2.
FIG. 11 is a flowchart illustrating control method 3.
FIG. 12 is a flowchart illustrating control method 4.
FIG. 13 is a configuration diagram illustrating an example of a scanning electron microscope equipped with an anti-contamination trap.
FIG. 14 is a sectional view illustrating main parts of an example of the charged particle beam apparatus equipped with the anti-contamination trap.
FIG. 15 is a plan view illustrating main parts of an example of the charged particle beam apparatus equipped with the anti-contamination trap illustrated in FIG. 14.

DESCRIPTION OF EMBODIMENTS

Hereinafter, a plurality of embodiments will be described by being divided, but unless otherwise specified, the embodiments are not unrelated to each other, in which one is a part of or all of the exemplary modifications, details, supplementary explanations, and the like. Further, the present invention is not necessarily limited to those having all the configurations described below, and it is possible to add, delete, and replace other components with respect to a part of the configuration of the embodiment, that is, various modification can be made within the scope of the present invention.

Hereinafter, an embodiment of the present invention will be described with reference to the drawings. In all the drawings for explaining the embodiment, in principle, the same members are designated the same reference numerals and signs, and the repeated description is omitted.

[Comparative Technique for Embodiment]

First, a comparative technique for the embodiment will be described. The inventors of the present invention found the following findings by investigation into techniques for preventing thermal damage to a sample and contamination of frost or the like.

In a case of cooling a target sample by fixing the sample to a member cooled by a cryogenic refrigerant such as liquid nitrogen, vibration is added to the sample due to bubbles generated when the refrigerant is vaporized, resulting in image disturbance.

In addition, when a temperature of the sample is −196° C. which is a temperature of the liquid nitrogen, it is necessary that a temperature of the cooling unit of the anti-contamination trap provided in the vacuum application apparatus to adsorb contamination such as frost is necessary is set to be −196° C. or lower. For this reason, an example of the refrigerant to be used includes slush-like (solid-liquid coexistence) nitrogen of −210° C., which is slurry fluid coexisting with solid-liquid obtained by evacuating liquid nitrogen, or liquid helium of −269° C.

Thus, it is possible to reduce vibration due to the refrigerant such as the liquid nitrogen. In addition, since a cooling temperature is lower compared with the case where the liquid nitrogen is used, the effect on thermal damage is improved.

However, when the slush-like refrigerant is used, the refrigerant solidifies and the volume of the refrigerant itself is reduced, and thus the reduced part becomes a cavity (vacuum or substantial vacuum). Thus, a portion (contact area) where the refrigerant contacts with an inner wall of a tank or a joint surface of the cooling unit, whereby heat conduction action from the refrigerant to the cooling unit also decreases and the temperature of the cooling unit rises. In a case where the sample is observed while being cooled, thermal drift occurs due to expansion and contraction of the member depending on a temperature change, so stabilization of the temperature is important; therefore, it is necessary to supply the refrigerant to the cavity and to lower the temperature again in order to stabilize the temperature of the cooling unit.

In the method according to the related art, since the sample is at a very low temperature, there is a problem of contamination that frost or carbon in the vacuum application apparatus is adsorbed to the sample and the sample becomes contaminated. For this reason, it is essential to provide a cooling unit called anti-contamination having a lower temperature than the sample in the vacuum application apparatus to prevent sample contamination.

FIG. 1 is an explanatory diagram illustrating an anti-contamination trap 110 of a comparative technique with respect to the present embodiment. FIG. 1 is a structural example in which the anti-contamination trap disclosed in Patent Literature 2 is drawn from the viewpoint of the inventors of the present application.

In this example, a case is indicated in which the temperature of the sample is −196° C. which is the temperature of the liquid nitrogen and the slush-like nitrogen of −210° C., which is slurry fluid coexisting with solid-liquid obtained by evacuating liquid nitrogen is used.

Here, the solid is superior to the liquid in terms of low temperature, but the liquid is superior in that the contact area with the object to be cooled is increased to transfer low-temperature heat. Therefore, the slurry fluid coexisting with solid and liquid, which can make use of both advantages, is used, but the refrigerant is biased to a solid when the degree of vacuum is high (pressure is low) and is biased to a liquid when the degree of vacuum is low (pressure is high).

In view of the above, the present invention is characterized in that the refrigerant solidifies (returns to a solid-liquid coexisting state) when the refrigerant is biased while maintaining the degree of vacuum. Further, it is characterized in that the refrigerant is maintained in the solid-liquid coexisting state without being biased to either of them by pressurization and depressurization of the interior of the cooling tank. That is, the pressure with respect to the refrigerant is changed so that no cavity is formed in the refrigerant in the cooling pipe. The "pressurization/depressurization" in the present embodiment means that the process of depressurizing and pressurizing is performed at least one.

The anti-contamination trap illustrated in FIG. 1A includes a cooling tank 1 for containing a refrigerant 2, a flange 3 for connecting a vacuum chamber 4 with the cooling tank 1, a cooling pipe 6 connected to the cooling tank 1, a cooling unit 5, a vaporized nitrogen discharge tube 7 for discharging nitrogen vaporized at a leading end of the cooling pipe 6, and a pump 9 for evacuating (depressurizing) the interior of the cooling tank 1 to make slush-like nitrogen. The cooling unit 5 is provided inside the vacuum application apparatus.

In the anti-contamination trap, when the refrigerant 2 (liquid nitrogen) is contained in the cooling tank 1, the refrigerant 2 is filled up to the cooling pipe 6, and the cooling unit 5 is cooled. First, the refrigerant 2 enters the cooling tank 1 which is at room temperature, some of the refrigerant 2 evaporates (vaporizes) to generate bubbles 8 of nitrogen. Such bubbles 8 are discharged through the vaporized nitrogen discharge tube 7, whereby the liquid nitrogen is filled up to the leading end of the cooling pipe 6 (FIG. 1B). In this way, the interior of the cooling tank 1 is gradually cooled. The cooling tank 1 has a structure in which the interior of double wall is evacuated and its outer wall has high heat insulation property, so the interior of the tank is kept at a low temperature. Thus, evaporation of the liquid nitrogen is reduced and bubbles are also reduced.

Next, the interior o the cooling tank 1 is evacuated (depressurized) by the pump 9. Then, some of the liquid nitrogen in the cooling tank 1 evaporates, and the remaining liquid nitrogen is cooled by the heat of vaporization and gradually solidifies. Then, the refrigerant 2 becomes a slurry fluid of solid-liquid coexistence in which a liquid part and a solid part (21) coexist (FIG. 1C), and reaches a temperature of −210° C.

It is desirable to maintain the state illustrated in FIG. 1C, but when the pump 9 is continuously operated to keep the vacuum state, the liquid nitrogen in the tank becomes completely solid nitrogen (FIG. 1D) and the volume of the nitrogen itself is reduced; the reduced part becomes a cavity (vacuum or substantial vacuum). That is, in the solid nitrogen compared with the nitrogen of solid-liquid coexistence, the contact area with the inner wall of the tank or the joint surface of the cooling unit decreases, whereby heat conduction action from the refrigerant to the cooling unit also decreases (cooling efficiency decreases) and the temperature of the cooling unit 5 rises.

[Embodiment]

Next, a charged particle beam apparatus according to the present embodiment will be described. The charged particle beam apparatus for cooling the cooling unit in the vacuum application apparatus has the following characteristics.

The charged particle beam apparatus includes a cooling tank for containing the refrigerant for the cooling unit, a cooling pipe for supplying the refrigerant from the cooling tank to the cooling unit, and a unit for guiding the refrigerant to liquefy when the refrigerant is biased to the solid.

The unit maintains the refrigerant in a solid-liquid coexisting state (continues to supply the refrigerant without forming a cavity in the refrigerant).

The unit leads the refrigerant to liquefy by pressurizing an interior of the cooling tank, and/or by heating the refrigerant, and/or by vibrating the refrigerant.

The unit maintains the refrigerant in a solid-liquid coexisting state by pressurizing and depressurizing an interior of the cooling tank.

The unit leads the refrigerant to liquefy by heating the refrigerant when the refrigerant is biased to a solid, and leads the refrigerant to solidify by depressurizing an interior of the cooling tank when the refrigerant is biased to a liquid.

The unit leads the refrigerant to liquefy by vibrating the refrigerant when the refrigerant is biased to a solid, and leads the refrigerant to solidify by depressurizing the cooling tank when the refrigerant is biased to a liquid.

The unit may include a pump that depressurizes the interior of the cooling tank and a leak valve that pressurizes the interior of the cooling tank. In addition, the unit may include a heater that heats the refrigerant. Furthermore, the unit may include a vibration generator that vibrates the refrigerant.

The unit may include a vacuum gauge that measures a degree of vacuum of the interior of the cooling tank and a control unit that controls the pump and/or the leak valve based on the degree of vacuum measured by the vacuum gauge, and the control unit may control the pump and/or the leak valve when the degree of vacuum measured by the vacuum gauge is a predetermined degree of vacuum.

In addition, the unit may include a thermocouple that measures a temperature of the interior of the cooling tank and a control unit that controls the pump and/or the leak valve based on the temperature measured by the thermocouple, and the control unit may control the pump and/or the leak valve when the temperature measured by the thermocouple is a predetermined temperature.

In addition, the unit may include a nitrogen gas cylinder that supplies a nitrogen gas through the leak valve, and the control unit may supply the nitrogen gas from the nitrogen gas cylinder through the leak valve.

The control unit may control various other functions of the unit.

The cooling unit may be disposed in the vicinity of a sample holder.

Structure Example 1 of Anti-Contamination Trap

FIG. 2 is an explanatory diagram illustrating structure example 1 of the charged particle beam apparatus. FIG. 2 illustrates an example for changing a pressure with respect to the refrigerant in the cooling tank.

In an anti-contamination trap illustrated in FIG. 2, a leak valve 10 and a thermocouple 16 are added to the structure in FIG. 1A. The leak valve 10 is a valve that causes a pressure change in the cooling tank 1 and injects air (which may be nitrogen gas or the like according to the purpose) into the cooling tank to pressurize the cooling tank in a vacuum state (depressurized state), for example. In addition, the thermocouple 16 is an instrument for measuring the temperature of the cooling unit 5.

When the interior of the cooling tank 1 is maintained in the vacuum state, the refrigerant solidifies. In order to maintain the solid-liquid coexisting state of the refrigerant, the operation of the pump 9 is stopped, and air is sucked into the cooling tank 1 by opening the leak valve 10 to raise (pressurize) the pressure inside the cooling tank 1. At this time, some of the solid nitrogen liquefies and flows into the cavity 11. Thus, the refrigerant 2 can be supplied to the cavity 11 formed in the anti-contamination trap. Then, after the refrigerant 2 is supplied to the cavity 11, it is possible to maintain the temperature of the cooling unit 5 at −210° C. by closing the leak valve 10 and exhausting (depressurizing) the cooling tank 1 with the pump 9. The temperature of the cooling unit 5 can be confirmed by measurement with the thermocouple 16.

However, it is conceivable that frost adheres to the interior of the cooling tank 1 by sucking the air at the time of leak, causing vibration and the like. Therefore, more devised structure examples will be sequentially described with reference to FIG. 3 and the subsequent drawings.

Structure Example 2 of Anti-Contamination Trap

FIG. 3 is an explanatory diagram illustrating structure example 2 of a charged particle beam apparatus. FIG. 3 illustrates an example for changing a pressure with respect to the refrigerant in the cooling tank without using air, and is a structure example for preventing adhesion of frost at the time of leak.

In the anti-contamination trap illustrated in FIG. 3, a nitrogen gas cylinder 12 is added to the structure in FIG. 2. The nitrogen gas cylinder 12 is an apparatus for supplying nitrogen gas into the cooling tank 1 through the leak valve 10.

Here, when the nitrogen gas is supplied from the nitrogen gas cylinder 12 to the cooling tank 1, it is possible to prevent the frost from adhering to the interior of the cooling tank 1. As in FIG. 2, after the refrigerant 2 is supplied to the cavity 11, it is possible to maintain the temperature of the cooling unit 5 at −210° C. by closing the leak valve 10 and exhausting the cooling tank 1 with the pump 9.

<Control Method 1 of Anti-Contamination Trap>

It is possible to add a function of automatically controlling the opening and closing of the leak valve 10 and the stop of operation of the pump 9 using the control unit 14 indicated by a broken line in FIGS. 2 and 3. For example, when a function of automatically controlling using a timer is added to the leak valve 10, the leak valve 10 can be opened and closed at predetermined intervals, and the temperature of the cooling unit 5 can be stabilized. FIG. 9 is a flowchart illustrating an example thereof.

FIG. 9 is a flowchart illustrating control method 1 of stably maintaining the temperature of the cooling unit. First, a continuous exhaust time, which is a time when the leak is started after the cooling unit 5 reaches −210° C. which is an attainment temperature of the slush-like nitrogen and a leak time which is a time to continue the leak are determined. Then, the continuous exhaust time and the leak time are input to the control unit 14, and the pump 9 is operated to exhaust the interior of the cooling tank 1 (S1). Thus, the pressure of the interior of the cooling tank 1 is depressurized.

After the input continuous exhaust time has elapsed, the pump 9 is stopped, the leak valve 10 is opened, and a leak is started (S2). By the start of the leak, the interior of the cooling tank 1 is pressurized. Next, after the input leak time has elapsed, the leak valve 10 is closed to operate the pump 9 again, and the interior of the cooling tank 1 is exhausted again (S3). Thereafter, returning to step S2, the pump 9 is stopped again.

As described above, when an operator inputs the continuous exhaust time and the leak time, the process is automatically performed by the control unit 14. The control unit 14 periodically performs opening and closing of the leak valve 10 and stopping of the operation of the pump 9, whereby the refrigerant 2 is supplied to the leading end of the cooling pipe 6 and the temperature can be stably maintained.

Structure Example 3 of Anti-Contamination Trap

FIG. 4 is an explanatory diagram illustrating structure example 3 of the charged particle beam apparatus. FIG. 4 illustrates an example for regularly performing a pressure change on a refrigerant in the cooling tank which is another structure example for stably maintaining the temperature of the cooling unit.

In an anti-contamination trap illustrated in FIG. 4, a vacuum gauge 13 and a control unit 14 for measuring a degree of vacuum in the cooling tank 1 are provided in addition to the configuration illustrated in FIG. 3. The control unit 14 controls start and stop operation of the pump 9 and opening and closing of the leak valve 10, based on the degree of vacuum measured by the vacuum gauge 13. With the control on the leak valve 10 and the pump 9 by the control unit 14, it is possible to supply the refrigerant 2 regularly and automatically to the vicinity of the cooling unit 5.

<Control Method 2 of Anti-Contamination Trap>

FIG. 10 is a flow chart illustrating a controlling method 2 for stably maintaining the temperature of the cooling unit in the anti-contamination trap illustrated in FIG. 4.

First, a continuous exhaust time, which is the time from when the cooling unit 5 reaches −210° C. of the reaching temperature of slashed nitrogen until starting a leakage, and an exhaust resuming degree-of-vacuum, which is the degree of vacuum for resuming exhaust due to deterioration of the degree of vacuum, are determined. Thereafter, the continuous exhaust time and the exhaust resuming degree-of-vacuum are input to the control unit 14 to start operation of the pump 9, thereby exhausting the interior of the cooling tank 1 (S11).

After the input continuous exhaust time e lapsed, the pump 9 is stopped and the leak valve 10 is opened, thereby starting a leakage (S12). Next, after the degree of vacuum in the cooling tank 1 measured by the vacuum gauge 13 reaches the input exhaust resuming degree-of-vacuum, the leak valve 10 is closed and the pump 9 is restarted to operate, thereby exhausting the interior of the cooling tank 1 again (S13). Thereafter, the process returns to S12, and the pump 9 is stopped again when the degree of vacuum reaches an appropriate value from restarting operation of the pump 9.

As described above, an operator inputs the continuous exhaust time and the exhaust resuming degree-of-vacuum, and the process is automatically performed by the control unit 14. Since the control unit 14 regularly performs opening and closing of the leak valve 10 and start and stop operation of the pump 9, based on the degree of vacuum in the cooling tank 1 measured by the vacuum gauge 13, the refrigerant 2 is supplied to the leading end of the cooling pipe 6, thereby stably maintaining the temperature. In addition, it is possible to prevent that the slashed nitrogen is completely liquefied due to deterioration of the degree of vacuum of the cooling tank 1.

<Control Method 3 of Anti-Contamination Trap>

FIG. 11 is a flow chart illustrating a controlling method 3 for stably maintaining the temperature of the cooling unit in the anti-contamination trap illustrated in FIG. 4.

First, a continuous exhaust time, which is the time from when the cooling unit 5 reaches −210° C. of the reaching temperature of slush-like nitrogen until starting a leakage, a pump restarting time, which is the time at which the pump 9 is restarted to operate, and an exhaust resuming degree-of-vacuum, which is the degree of vacuum for resuming exhaust due to deterioration of the degree of vacuum, are determined. Thereafter, the continuous exhaust time, the pump restarting time, and the exhaust resuming degree-of-vacuum are input to the control unit 14 to start operation of the pump 9, thereby exhausting the interior of the cooling tank 1 (S21).

After the input continuous exhaust time e lapsed, the pump 9 is stopped, thereby automatically starting a leakage (S22). During the automatic leakage, the pressure in the cooling tank 1 gradually rises and the solid nitrogen is gradually liquefied to be a slurry state in which solids and liquids coexist.

Next, after the input pump restarting time has elapsed, or when the degree of vacuum in the cooling tank 1 measured by the vacuum gauge 13 reaches the input exhaust resuming degree-of-vacuum, the pump 9 is restarted to operate, thereby exhausting the interior of the cooling tank 1 again (S23). Thereafter, the process returns to S22, and the pump 9 is stopped when the degree of vacuum reaches an appropriate value due to the restarting operation of the pump 9, thereby maintaining the temperature.

As described above, an operator inputs the continuous exhaust time, the pump restarting time, and the exhaust resuming degree-of-vacuum, and the process is automatically performed by the control unit 14. Since the control unit 14 performs start and stop operation of the pump 9, based on the degree of vacuum in the cooling tank 1 measured by the vacuum gauge 13, the refrigerant 2 is supplied to the leading end of the cooling pipe 6, thereby stably maintaining the temperature. In addition, it is possible to prevent that the slush-like nitrogen is completely liquefied due to deterioration of the degree of vacuum of the cooling tank 1. Further, since the stop time of the pump 9 is prolonged, it is possible to reduce consumption of liquid nitrogen and vibration due to the pump 9.

Structure Example 4 of Anti-Contamination Trap

FIG. 5 is an explanatory diagram illustrating structure example 4 of a charged particle beam apparatus. FIG. 5 illustrates an example for providing vibration to the refrigerant in the cooling tank, and a structure example for supplying the refrigerant to the cavity formed in the vicinity of the cooling unit.

The anti-contamination trap illustrated in FIG. 5 differs from the structure example using the leak valve 10 as in FIGS. 2 to 4, and has a configuration in which a thermocouple 16 and a vibration generator 15 for vibrating the refrigerant 2 in the cooling tank 1 are added to the configuration in FIG. 1. When the refrigerant 2 is periodically vibrated in the vicinity of the cooling unit 5 by the vibration generator 15, it is possible to lead the solidified nitrogen to liquefy and to supply the slush-like nitrogen to the vicinity of the cooling unit 5.

Structure Example 5 of Anti-Contamination Trap

FIG. 6 is an explanatory diagram illustrating structure example 5 of a charged particle beam apparatus. FIG. 6 illustrates another structure example in which the temperature of the cooling unit is read from the thermocouple 16 and a pressure change with respect to the refrigerant in the cooling tank is periodically performed, thereby maintaining stably the temperature of the cooling unit.

In FIG. 6, the control unit 14 indicated by the dotted line in FIG. 3 is connected to the thermocouple 16. The control unit 14 can periodically and automatically supply the refrigerant 2 to the vicinity of the cooling unit 5 by controlling the operation stop of the pump 9 and the opening and closing of the leak valve 10 based on the temperature measured by the thermocouple 16.

<Control Method 4 of Anti-Contamination Trap>

FIG. 12 is a flowchart illustrating control method 4 for stably maintaining the temperature of the cooling unit in the anti-contamination trap illustrated in FIG. 6.

First, a continuous exhaust is performed until the cooling unit 5 reaches a solid nitrogen temperature of −210° C. (S31). After the cooling unit reaches −210° C., the temperature of the cooling unit starts to rise due to the lowering of cooling efficiency depending on solid-nitrifying. The control unit 14 reads the temperature rise from the thermocouple 16, and stops the pump 9 (S32). Thereafter, the control unit opens the leak valve to gradually raise the pressure (S33). Due to the inflow of air, the solid nitrogen in the tank gradually liquefies and becomes a slurry fluid coexisting with solid-liquid, and the temperature of the cooling unit returns to −210° C. Upon reading this temperature, the control unit 14 closes the leak valve and brings it into a sealed state (S34). Thus, the inflow of air is suppressed, and the temperature rise and the inflow of frost in the tank are suppressed. However, since the liquefaction of the solid nitrogen gradually progresses by the stop of vacuum exhaust, the temperature of the cooling unit gradually rises.

Here, when the control unit 14 sets a temperature, for example, −200° C., at which the re-exhaust is performed (S35), the vacuum exhaust in the tank is started by the pump 9 at the time when the temperature of the cooling unit reaches −200° C. (S36). Thereafter, the process returns to step S32, steps S32 to S36 are repeated. The operator can maintain automatically the cooling temperature by setting the re-exhaust temperature. The temperature setting in step S35 may be set in advance by the operator.

Structure Example 6 of Anti-Contamination Trap

An anti-contamination trap illustrated in FIG. 7 includes a heater for heating the refrigerant 2 in the cooling tank 1, unlike the structure example using the leak valve 10 as illustrated in FIGS. 2 to 4. In FIG. 7, a heater 17 for heating the vicinity of the cooling unit 5 is added in addition to the thermocouple 16 as compared with the configuration in FIG. 1.

In the anti-contamination trap illustrated in FIG. 7, the refrigerant 2 is periodically heated in the vicinity of the cooling unit 5 by the heater 17, whereby the solid nitrogen can be liquefied and supplied to the vicinity of the cooling unit 5.

<Structure Example of Sample Holder>

The structure of the anti-contamination trap and the control method thereof can also be applied to a sample holder that can be cooled. FIG. 8 illustrates an example in which a cooling mechanism of the anti-contamination trap illustrated in FIG. 4 is applied to a sample holder. A thermocouple 16, a heater 17, and a sample fixing portion 19 are provided at the leading end of the cooling unit 5, and the sample 18 is fixed to the sample fixing portion 19. Further, an electron beam transmitting hole 20 is located below a sample-mounted position so that a thin sample is irradiated with the electron beam and the transmitted electron can be observed (TEM•STEM method).

As described above, when the sample is observed while being cooled, thermal drift occurs due to expansion and contraction of the member depending on a temperature change, so stabilization of the temperature is important. For this reason, the heater 17 and the thermocouple 16 are provided in the vicinity of the sample and function as a mechanism capable of maintaining the set temperature.

<Scanning Electron Microscope>

FIG. 13 is a configuration diagram illustrating an example of a scanning electron microscope (SEM) installed with the anti-contamination traps in FIGS. 2 to 7.

The SEM 101 includes, for example: an electron optical lens barrel 107 that radiates an electron beam 103; a control system (not illustrated) that adjusts each condition of the electron optical lens barrel 107; a secondary electron detector 108 that detects a secondary electron emitted from a sample due to irradiation of the sample with the electron beam 103; a sample holder 109 capable of freezing and cooling the sample; an anti-contamination trap 110 illustrated in FIGS. 2 to 7; and a pump 9 that is used for slush of the refrigerant. Note that it is also possible to dispose a transmission electron detector capable of detecting an electron that has transmitted through the sample, below the sample.

Inside the scanning electron optical lens barrel 107, there is provided: an electron source 102; a first condenser lens 104 and a second condenser lens 105 that converge the electron beam 103 emitted from the electron source 102; a deflection coil 106 that scans with the electron beam 103; and an objective lens that focuses the electron beam 103. The objective lens includes an upper magnetic pole 111 and a lower magnetic pole 112.

Furthermore, a stage 113 is provided on a side surface of the electron optical lens barrel 107, and the sample holder 109 holding the sample is disposed between the upper magnetic pole 111 and the lower magnetic pole 112 of the objective lens. The anti-contamination trap 110 is provided on another side surface of the electron optical lens barrel 107 where the stage 113, which moves a leading end portion of the sample holder 109 in a desired direction. A cooling unit 5 at a leading end of the anti-contamination trap 110 is positioned in the vicinity of the sample between the upper magnetic pole 111 and the lower magnetic pole 112 of the objective lens in a vacuum chamber 4. A thermocouple 16 is installed in the cooling unit 5 at the leading end of the anti-contamination trap 110 to measure a temperature.

Since the sample is disposed between the upper magnetic pole 111 and the lower magnetic pole 112 of the objective lens, the SEM 101 called a lens-type SEM. In the SEM 101, a portion of a vacuum state on a path through which the sample held by the sample holder 109 is irradiated with the electron beam 103 is referred to as a vacuum application apparatus.

According to the SEM 101, it is possible to efficiently observe a material or the like susceptible to damage by irradiation with the electron beam 103 while taking advantages of the effects of the anti-contamination traps illustrated in FIGS. 2 to 7.

<Charged Particle Beam Apparatus>

The charged particle beam apparatus equipped with the anti-contamination traps illustrated in FIGS. 2 to 7 will be described below with reference to FIGS. 14 and 15. FIGS. 14 and 15 are explanatory diagrams illustrating main parts of an example of the charged particle beam apparatus equipped with the anti-contamination trap according to the embodiment; FIG. 14 is a cross-sectional view, and FIG. 15 is a plan view.

The main parts of the charged particle beam apparatus include, for example: the sample holder 109 that holds the sample 18 and cools the sample 18 with a liquid refrigerant (liquid nitrogen); the cooling unit 5 that cools the sample 18 with the slush-like refrigerant (slush-like nitrogen); and the pump 9 that is used for slush of the anti-contamination trap 110 illustrated in FIGS. 2 to 7 and the refrigerant.

The cooling unit 5 has a structure of a square tubular shape in which plate-like portions are provided at upper, lower, left, and right sides in a cross-sectional view (FIG. 14) and in which an opening is provided at an upper part thereof so as not to block the electron beam 103 or the like. In the structure of the cooling unit 5, the sample holder 109 is inserted into the square tubular shape of the cooling unit 5, and the sample 18 held by the sample holder 109 is irradiated with the electron beam 103. Then, the secondary electron emitted from the sample 18 is detected by the irradiation of the electron beam 103, and thus the sample 18 can be observed and analyzed. When an opening is also provided at a lower part of the square tubular shape, it is also possible to detect electrons transmitted through the sample 18.

According to the charged particle beam apparatus of the present embodiment, even when the temperature of the sample 18 is lowered to the temperature of the liquid nitrogen (−196° C.), frost hardly adheres to the sample 18 because the anti-contamination trap 110 is at a lower temperature (−210° C.). In addition, since the temperature of the sample 18 can be lowered, it is possible to reduce electron beam damage and thermal damage to the sample 18.

In addition, since the temperature rise due to the electron beam 103 can be reduced, amorphous ice is hardly crystallized. For example, in a cryo-system, the sample 18 may be observed by being fixed to a film of the amorphous ice. The amorphous ice will be crystallized at a temperature higher than about −120° C. Unless the sample 18 is sufficiently cooled, the amorphous ice is crystallized when being irradiated with the electron beam 103. When the amorphous ice is crystallized, the structure of the ice becomes an artifact, and the original structure of the sample is lost. In the present embodiment, since the temperature rise due to the electron beam 103 can be reduced, the amorphous ice is not crystallized.

Further, since the electron beam damage and the thermal damage are small, the magnification of the charged particle beam apparatus can be increased.

<Modified Example/Applicable Example>

In the above-described charged particle beam apparatus illustrated in FIG. 14, the cooling unit 5 has the square tubular shape, but the present invention is not limited thereto and various modifications are applicable. For example, in the cross-sectional view similar to FIG. 14, the cooling unit has a structure in which the plate-like portions are provided at the upper and lower parts and the openings are provided in the upper and lower plate-like portions so as not to block electron beams and transmitted electrons. In the structure of the cooling unit, the sample holder is disposed so as to be sandwiched between the upper and lower plate-like portions, and thus the sample can be observed and analyzed.

Another cooling unit has a structure in which a plate-like portion is provided at a lower part and an opening is provided in the lower plate-like portion so as not to block transmitted electrons. In such a structure of the cooling unit, the sample holder is disposed on the plate-like portion, and thus the sample can be observed and analyzed.

Further, in another cooling unit, it is also conceivable to have a structure of a hemispherical shape in which a central part protrudes in a direction of the sample, or on the contrary to this, a structure of a U-shape in which the central part is recessed. Similarly, even in such a structure of the cooling unit, the sample can be observed and analyzed.

In addition, the present embodiment is applicable to a semi-in-lens type or an out-lens type scanning electron microscope without being limited to the in-lens type scanning electron microscope as illustrated in FIG. 13. Further, it can also be applied to various electron microscopes including a transmission electron microscope (TEM) and the like. The transmission electron microscope can provide optimal analysis solution in various fields from biomedical to food/agriculture, polymer/chemistry, and nanomaterial.

In the present embodiment, the refrigerant in which the liquid nitrogen is subjected to slush is used, but the present invention is applicable to a refrigerant in which liquid helium is subjected to slush, for example.

The present invention is an effective technique when is used for a vacuum application apparatus such as a charged particle beam apparatus or a freeze drying apparatus in addition to an electron microscope such as a scanning electron microscope or a transmission electron microscope. Further, the present invention can also be used for a focused ion beam system (FIB) using an ion beam, an ion microscope, or the like. In particular, it is suitable for a technique that enables stable temperature maintenance and measurement in a cooling unit in a vacuum application apparatus equipped with an anti-contamination trap.

REFERENCE SIGNS LIST

1: cooling tank
2: refrigerant
3: flange
4: vacuum chamber
5: cooling unit
6: cooling pipe
7: vaporized nitrogen discharge tube
8: bubble
9: pump
10: leak valve
11: cavity
12: nitrogen gas cylinder
13: vacuum gauge
14: control unit
15: vibration generator
16: thermocouple
17: heater
18: sample
19: sample fixing portion
20: electron beam transmitting hole
101: scanning electron microscope
102: electron source
103: electron beam
104: first condenser lens
105: second condenser lens
106: deflection coil
107: electron optical lens barrel
108: secondary electron detector
109: sample holder
110: anti-contamination trap
111: upper magnetic pole
112: lower magnetic pole
113: stage

The invention claimed is:

1. A charged particle beam apparatus for cooling a cooling unit inside a vacuum application apparatus, comprising:
    a cooling tank that contains a refrigerant for cooling the cooling unit;

a cooling pipe that supplies the refrigerant from the cooling tank to the cooling unit;

a unit, comprising:

a pump configured to exhaust the interior of the cooling tank to depressurize the interior of the cooling tank;

a valve configured to inject gas into the interior of the cooling tank to pressurize the interior of the cooling tank; and a vacuum gauge configured to measure a degree of vacuum of the interior of the cooling tank; and a controller configured to:

control the refrigerant to liquefy when the refrigerant is biased to a solid;

control the pump and the valve to maintain the refrigerant in a solid-liquid coexisting state by pressurizing and depressurizing an interior of the cooling tank based on the degree of vacuum measured by the vacuum gauge; and control operation of at least one of the pump and the valve when the degree of vacuum measured by the vacuum gauge is a predetermined degree of vacuum.

2. The charged particle beam apparatus according to claim 1, wherein
the controller is configured to control the refrigerant to liquefy by pressurizing the interior of the cooling tank.

3. The charged particle beam apparatus according to claim 1, wherein
the controller is configured to control the refrigerant to liquefy by heating the refrigerant.

4. The charged particle beam apparatus according to claim 1, wherein
the controller is configured to control the refrigerant to liquefy by vibrating the refrigerant.

5. The charged particle beam apparatus according to claim 1, wherein
the controller is configured to control the refrigerant to liquefy by heating the refrigerant when the refrigerant is biased to a solid, and control the refrigerant to solidify by depressurizing the interior of the cooling tank when the refrigerant is biased to a liquid.

6. The charged particle beam apparatus according to claim 1, wherein
the controller is configured to control the refrigerant to liquefy by vibrating the refrigerant when the refrigerant is biased to a solid, and leads the refrigerant to solidify by depressurizing the cooling tank when the refrigerant is biased to a liquid.

7. The charged particle beam apparatus according to claim 5, wherein
the unit includes a heater that heats the refrigerant.

8. The charged particle beam apparatus according to claim 6, wherein
the unit includes a vibration generator that vibrates the refrigerant.

9. The charged particle beam apparatus according to claim 1, wherein
the unit further includes a thermocouple that measures a temperature of the interior of the cooling tank and the controller is configured to control at least one of the pump and the valve based on the temperature measured by the thermocouple, and
the controller controls the pump and the valve when the temperature measured by the thermocouple is a predetermined temperature.

10. The charged particle beam apparatus according to claim 1, wherein
the unit further includes a nitrogen gas cylinder that supplies a nitrogen gas through the valve, and
the controller supplies the nitrogen gas from the nitrogen gas cylinder through the valve.

11. The charged particle beam apparatus according to claim 1, wherein
the cooling unit is disposed in the vicinity of a sample holder.

12. The charged particle beam apparatus according to claim 1, wherein
the cooling unit is formed integrally with a sample holder.

13. A control method of a charged particle beam apparatus for cooling a cooling unit inside a vacuum application apparatus, the control method comprising steps of:

supplying a refrigerant from a cooling tank to the cooling unit, the cooling tank containing the refrigerant for cooling the cooling unit; and controlling the refrigerant to liquefy when the refrigerant is biased to a solid;

maintaining the refrigerant in a solid-liquid coexisting state by controlling a valve to inject gas into the interior of the cooling tank to pressurize the interior of the cooling tank and controlling a pump to exhaust the interior of the cooling tank to depressurize the interior of the cooling tank based on a measured degree of vacuum; and controlling operation of at least one of the pump and the valve when the measured degree of vacuum is a predetermined degree of vacuum.

* * * * *